United States Patent [19]
Rowson

[11] Patent Number: 5,490,082
[45] Date of Patent: Feb. 6, 1996

[54] METHOD OF GRAPHICALLY DESIGNING CIRCUITS

[75] Inventor: James A. Rowson, Fremont, Calif.

[73] Assignee: VLSI Technology, Inc., San Jose, Calif.

[21] Appl. No.: 612,282

[22] Filed: Nov. 7, 1990

[51] Int. Cl.⁶ .................................................. G06F 17/50
[52] U.S. Cl. ........................................ 364/489; 364/491
[58] Field of Search ................................ 364/488, 489, 364/490, 491

[56] References Cited

U.S. PATENT DOCUMENTS

| | | | |
|---|---|---|---|
| 4,700,317 | 10/1987 | Watanabe et al. | 364/488 |
| 4,703,435 | 10/1987 | Darringer et al. | 364/489 |
| 4,813,013 | 3/1989 | Dunn | 364/488 |
| 4,831,543 | 5/1989 | Mastellone | 364/489 |
| 4,896,272 | 1/1990 | Kurosawa | 364/491 |
| 4,922,432 | 5/1990 | Kobayashi et al. | 364/490 |
| 4,954,953 | 9/1990 | Bush | 364/489 |
| 4,967,367 | 10/1990 | Piednoir | 364/489 |
| 4,970,664 | 11/1990 | Kaiser et al. | 364/488 |
| 5,005,136 | 4/1991 | Van Berkel et al. | 364/490 |
| 5,034,899 | 7/1991 | Schult | 364/488 |

OTHER PUBLICATIONS

"Hierarchical Logic Synthesis System for VLSI" by Matsumoto et al., IEEE Proceedings of ISCAS 85, 1985, pp. 651–654.

"Method Used in an Automatic Logic Design Generator (ALERT)" by Friedman et al., IEEE Trans. on Computers, vol. C–18, No. 7, Jul. 1969, pp. 593–614.

"Experiments in Logic Synthesis" by John A. Darringer et al., IEEE ICCC 1980, pp. 234–237A.

"A New Look at Logic Synthesis" by John A. Darringer et al., 17th Design Automation Conf., IEEE 1980, pp. 543–548.

D. L. Dietmeyer, "Logic Design of Digital Systems", Chapter 3—Synthesis of Combinational Logic Networks, Allynt Bacon, Boston, 1978, pp. 156–238.

*Primary Examiner*—Vincent N. Trans

[57] ABSTRACT

The present invention relates to methods for designing circuits using graphical representations of control and data flow paths. Such representations afford a circuit designer an opportunity early in the design phase to view the data flow and control flow of a proposed circuit layout. Further, such representations are relatively easy to automatically scan, analyze and reduce into a set of logical notations suitable for input to known, standard logic synthesizers.

16 Claims, 4 Drawing Sheets

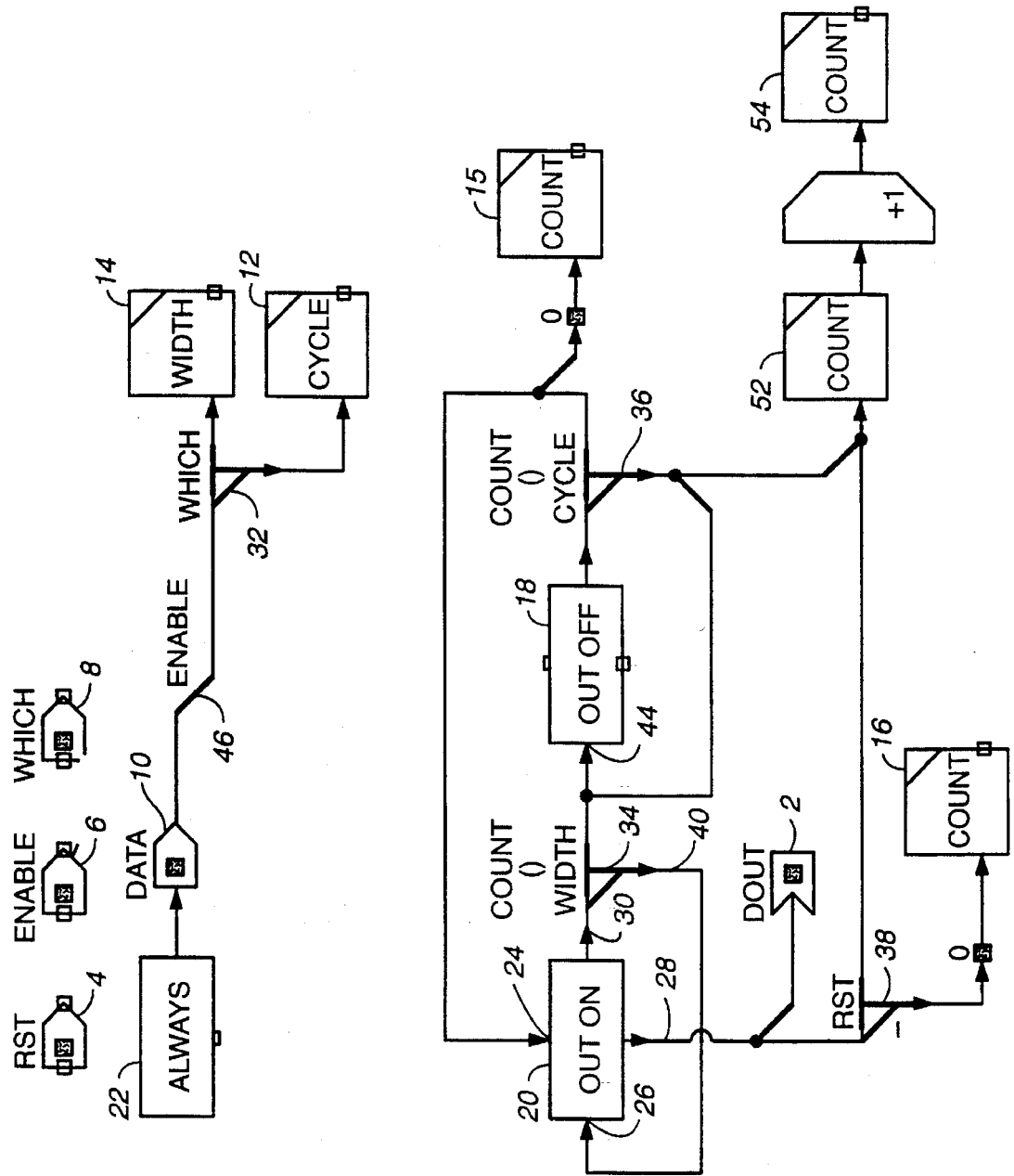
FIG._1

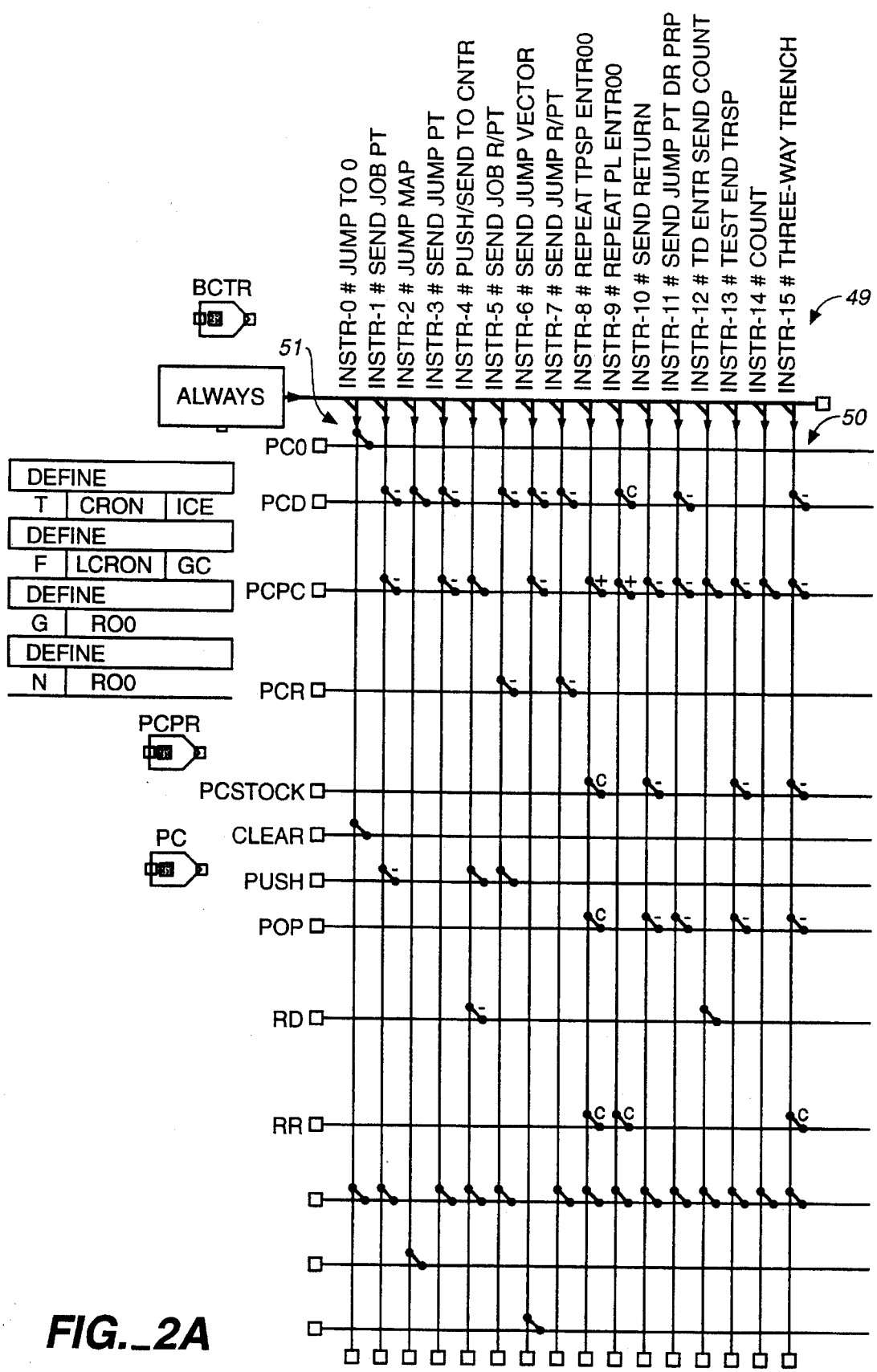
FIG._2A

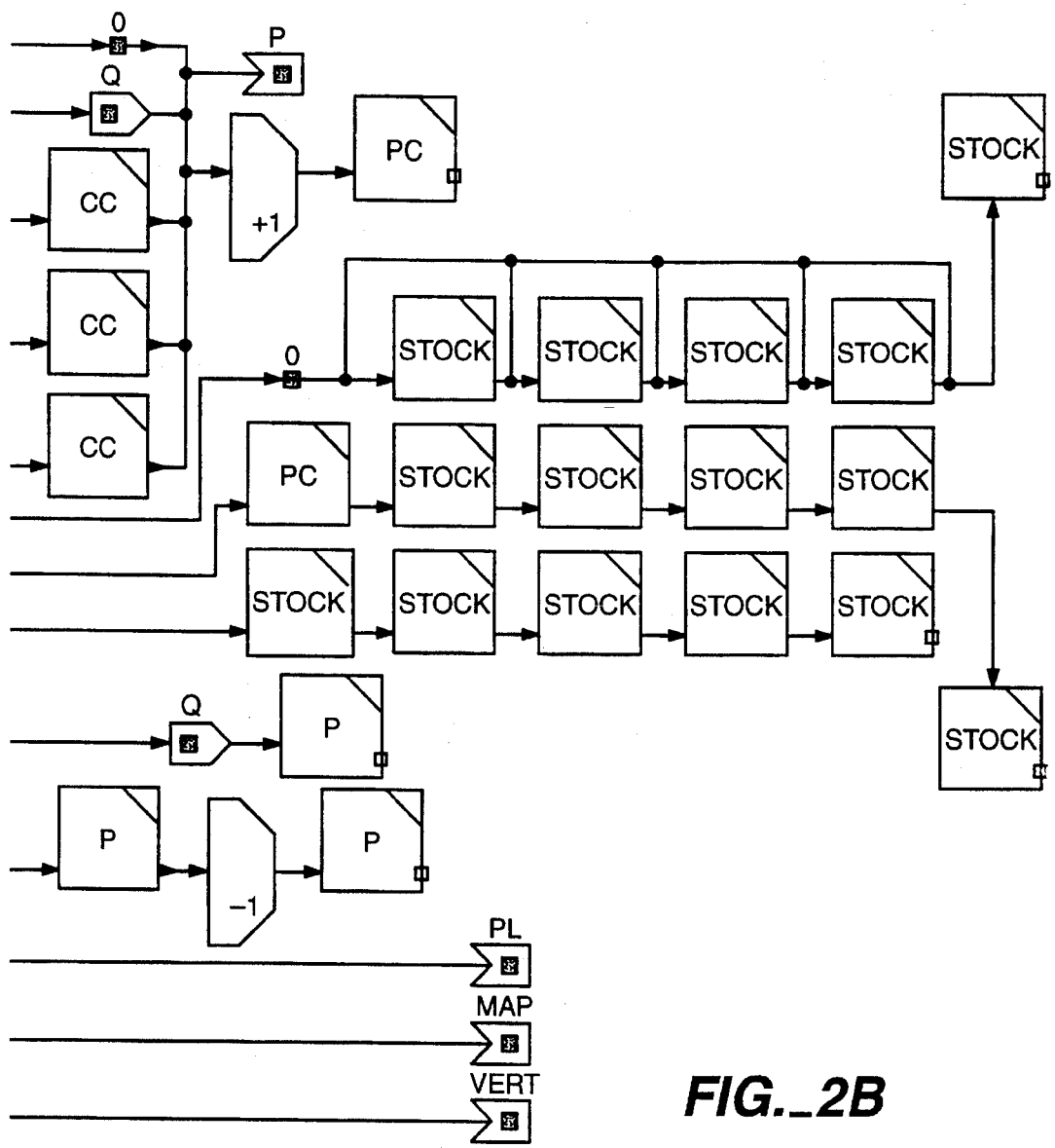
FIG._2
FIG._2B

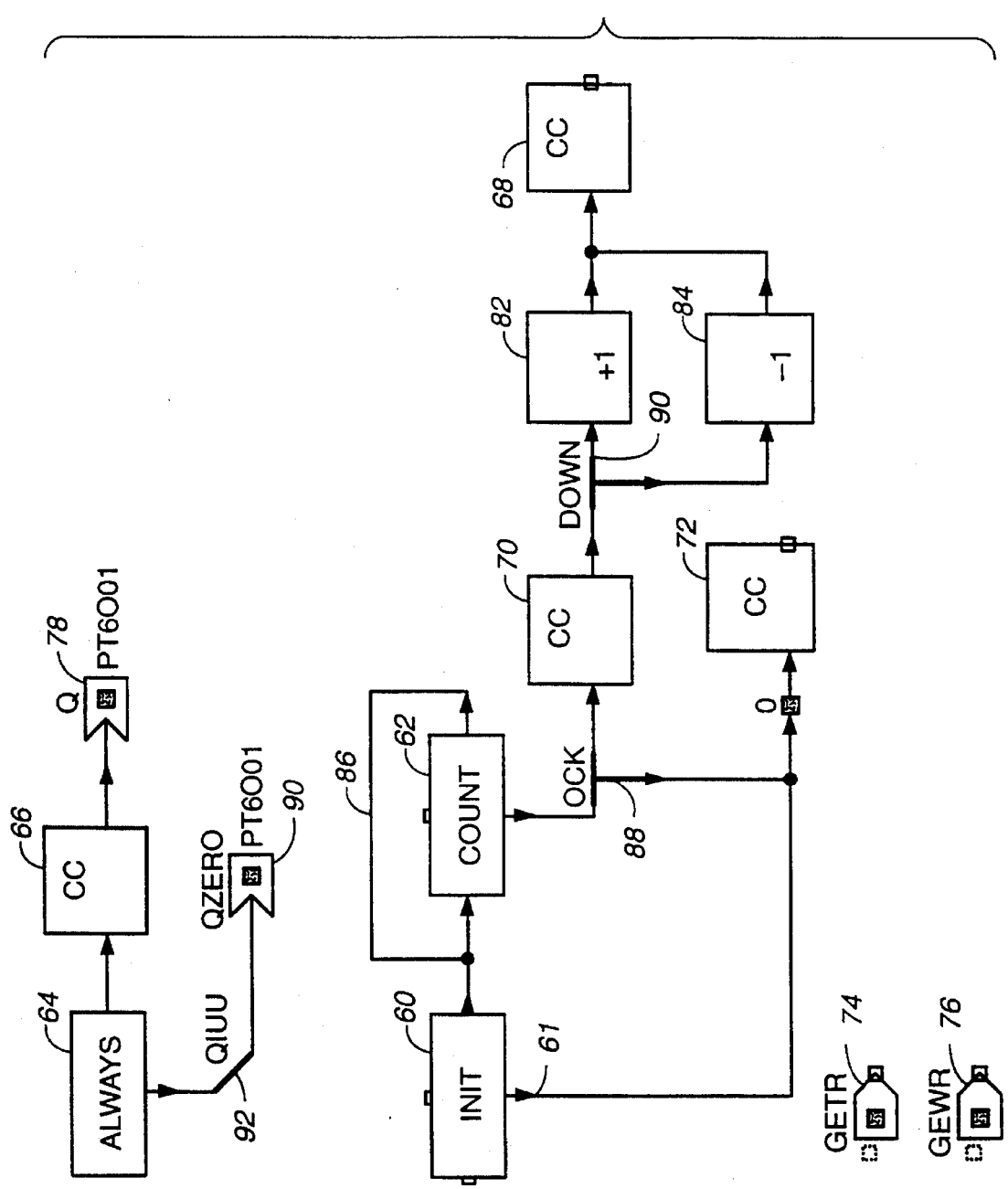
FIG._3

METHOD OF GRAPHICALLY DESIGNING CIRCUITS

BACKGROUND OF THE INVENTION

1. Field of the Invention

The present invention generally relates to systems for designing circuits and, more particularly, to systems for modelling and synthesizing circuits such as gate array or cell-based application specific integrated circuits (ASICs) using graphical representations.

2. State of the Art

It is known to describe or specify circuit layouts during their design using schematic symbols (e.g., logic gate symbols) and wire connections. These schematic representations enable designers to view layouts as a whole, including connections between electrical components in the layouts.

Logic synthesis tools also have been developed for assisting in the transition from a schematic circuit representation to a set of logical equations, such as Boolean equations. The logical equations define circuit operations and can be used to construct efficient implementations of circuit layouts in hardware form (e.g., transistor-level implementations). In operation, logic synthesis tools scan one or more hand-drawn schematic diagrams to provide a set of equations that describe the circuit layout. The equations are then processed to create an efficient organization of the electronic logic gates for executing the equations. Typically, the output of a logic synthesizer is a netlist of circuit components and information needed to attain proper circuit implementation and operation.

Analysis of complete schematic diagrams of integrated circuit layouts to provide sets of boolean equations is, however, complex and time consuming for logic synthesis tools. Further, the schematic diagrams make evaluation of circuit control flow relatively difficult since the diagrams only represent hardwired connections of the circuit elements without any timing (e.q., control flow) information.

To reduce the complexity of automated circuit layout design, logic synthesis tools have been developed that receive a set of boolean equations as a direct input. Because these logic synthesis tools do not analyze schematic diagrams, they deprive circuit designers of the opportunity to work with and view schematic circuit layouts. Such synthesis tools do not permit visualization of both control flow and data flow in the circuit, and, instead, require circuit designers to work with relatively complex logical equations.

SUMMARY OF THE INVENTION

Generally speaking, the present invention relates to methods for designing circuit layouts, using graphical representations of circuit components and associated functions. Such representations afford a circuit designer an opportunity early in the design phase to view data flow and control flow of a proposed circuit layout, using relatively simple logical equations. Such representations are relatively easy to automatically scan, analyze and reduce into a set of complex logical equations suitable for input to known, standard logic synthesizers.

BRIEF DESCRIPTION OF THE DRAWINGS

The present invention can be further understood by reference to the following description and the appended drawings which illustrate the invention. For purposes of description, identical components are given the same reference numerals in the various drawing figures. In the drawings:

FIG. 1 is one exemplary application of the present invention to a first circuit layout;

FIG. 2 comprises FIGS. 2A and 2B.

FIGS. 2A and 2B are circuit layout representation of a known microsequencer which can be used with the FIG. 1 circuit layout; and, FIG. 3 is a second exemplary application of the present invention to a second circuit layout.

DETAILED DESCRIPTION OF PREFERRED EMBODIMENTS

For purposes of the discussion which follows, a circuit layout should be understood to be represented by a combination of relatively simple primitives and logical equations, where a primitive is a basic component of a circuit layout at a given stage in the layout design process. Primitives can be provided for both control and data flow. Preferably, there are two types of control primitives: timeperiod primitives and decision primitives. The timeperiod control primitives will be referred to herein as normal-time period, reset-time period, or always-time period control primitives. The two types of decision primitives will be referred to herein as matrixrow and matrixcolumn decision primitives. It should be understood that connections between the above-described primitives represent the flow of control and data.

Timeperiods indicate when a given circuit operation or operations should occur. In an exemplary embodiment, timeperiods are exactly one clock cycle long. When a timeperiod primitive is active, then primitives connected with that timeperiod may be activated. There are, however, additional situations wherein timeperiods will be placed in an activated state. For example, reset-timeperiods also become active when the circuit receives a reset input, and always-timeperiods are always active. Further, normal timeperiods are placed into an inactive state upon occurrence of a reset input.

Each of the matrixrow and matrixcolumn decision primitives has a relatively simple logic equation associated therewith which defines their function. A matrixcolumn is, for example, an IF-THEN-ELSE representation. If the equation associated with the matrixcolumn primitive is true, then control is passed in a first direction. If the equation is false, control is passed in a second direction.

Matrixrow primitives are simply IF-THEN representations. If the equation associated with the matrixrow primitive is true, then control is passed through the matrixrow to the next sequentially situated primitive(s). If the equation is not true, control is not passed.

A circuit layout design for a simple programmable clock using the above-described control and data flow primitives is shown in FIG. 1. The overall function which the FIG. 1 circuit is intended to provide is as follows. Following an initialization reset signal, a predetermined number of clock periods are to be counted. During this count period, an output of the circuit is to be logic level high. Once the predetermined count is attained, the counter output will return to a logic level low.

For this purpose, the programmable clock is designed in accordance with an exemplary embodiment as follows. The FIG. 1 clock is provided with a single clock output 2 labelled dout. Four inputs 4, 6, 8 and 10 are provided to the programmable clock. The input 4 represents a reset input for resetting the programmable counter. The input 6 represents an enable for writing into the programming registers. The input 8 is labelled "which". This input selects a register into which data is to be written. Finally the input 10 represents a data input for causing data to be written into a register.

In the FIG. 1 circuit layout, there are two programmable registers. A first programmable register 12, referred to as cycle, is a register for controlling the period of the output clock. A second programmable register 14 referred to as width controls the length of time the output clock is high. An internal register referred to as count is used as a storage register primitive to divide the input clock. Various instances of the count storage primitive in the FIG. 1 circuit design are labelled 15, 16, 52 and 54.

Each of the aforementioned three types of timeperiods (i.e., normal-timeperiod, reset-timeperiod and always-timeperiod) are shown in FIG. 1 as elements 18, 20 and 22, respectively. In the example of FIG. 1, each timeperiod has up to four connectors, two of which are inputs and two of which are outputs. In FIG. 1, the top and left connectors (e.g., connectors 24 and 26 of reset-timeperiod 20) are inputs, and the bottom and right connectors (e.g., connectors 28 and 30 of reset-timeperiod 20) are outputs.

The lines that connect a first timeperiod to a subsequent timeperiod indicate that the subsequent timeperiod will be active one clock cycle after the former. For example, the normal-timeperiod 18 can, at the earliest, be activated one clock cycle after the timeperiod 20 is active.

In FIG. 1, elements 32, 34, 36 and 38 represent matrixcolumn decision primitives (i.e., IF-THEN-ELSE representations). As mentioned previously, each matrixcolumn primitive is associated with an equation which directs control through the matrixcolumn. As shown in FIG. 1, each matrixcolumn primitive includes three connectors. A first of these connectors receives control, and two of the connectors pass control to subsequent primitives.

For example, the matrixcolumn 34 of FIG. 1 has been labelled by a circuit designer with the equation "count <> width". Accordingly, if the value stored in the count storage register is less than or greater than the value preset into the programmable width register 14, the foregoing equation is true such that control received via the output connector 30 of the "outon" reset-timeperiod is routed down onto connector 40 of matrixcolumn 34. In this case, the reset-timeperiod "outon" will remain active via input 26.

On the contrary, if the equation "count <> width" is false (e.g., the value of count equals the value preset into the width register), control is passed across the matrixcolumn 34. In the FIG. 1 example, control would be passed to the input 44 of "outoff" normal-timeperiod 18.

Matrixrow decision primitives are also utilized in the FIG. 1 example. For example, matrixrow 46 has the equation "enable" associated therewith and receives a value provided by the data input 10. If the enable input 6 is true, the matrixrow 46 permits data to be written into the programming registers 12 and 14 via matrixcolumn 32. Otherwise, control does not pass to the matrixcolumn 32. Regardless of the condition of the "which" equation associated with matrixcolumn 32, this matrixcolumn will not be active until matrixrow 46 has been enabled.

The matrixcolumn and matrixrow decision primitives are thus named for their ability to create a decision matrix for decoding complex instruction sets. One exemplary graphical description of a microsequencer for controlling the sequential activation of programmed steps of a circuit (e.g., the FIG. 1 circuit layout) is shown in FIG. 2 and better illustrates how the decision primitives create a decision matrix.

As can be seen in the area 50 of FIG. 2, a table of matrixcolumns and matrixrows are created. The matrixcolumns are collectively represented as element 49 and represent a sequential decoding of instructions from the left to the right of FIG. 2. The occurrence of a valid matrixcolumn results in a branch downward to execute the operations associated with active rows of the FIG. 2 decision matrix. The matrixrows, such as matrixrow 51, selectively activate data operations (e.g., load data into the storage registers shown to the right in FIG. 2) associated with an active instruction.

Returning to the FIG. 1 example, dataflow is accomplished using data oriented, or dataflow, primitives which are labelled constant, storage, external input/output and unary operator. Additional data oriented primitives such as memory reference and binary operator dataflow primitives can be used to reference data stored in a memory or to effect a binary operation, respectively.

A basic memory element for forming storage devices in an exemplary implementation of the FIG. 1 clock is an n-bit register. Referencing an output connector of a register (such as the count storage register) provides the current value stored therein. Connection of a primitive to the input of a register results in one of two functional behaviors. If a valid new-value equation indicates that the register contents should be updated then that value is written into the storage element at the end of the timeperiod. Alternatively, the value of the storage element remains unchanged.

In operation, a path must exist from an active timeperiod to dataflow primitives for an operation to be executed. As shown in FIG. 1, a key attribute of storage elements is that the circuit designer can place the same storage element in many different physical locations. Such a feature can simplify the pictorial representation of complex operations. For example, in FIG. 1 the count storage element is used in four locations. In two of these four locations, the constant zero is loaded into the count storage element: once during an active reset-timeperiod "outon" if the reset input 4 is true, and once during the normal-timeperiod "outoff" if the value of count and cycle are equal (i.e., control passes across the matrixcolumn 36).

The remaining two of the aforementioned four locations are accessed if the value of count and cycle are not equal (i.e., control passes down the matrixcolumn 36). The first of these two remaining count storage elements is labelled 52 and has no valid new-value equation at its input. That is, when searching backwards from count storage element 52 along control flow routes connected thereto, only timeperiods are encountered. Although matrixrows and matrixcolumns may also be encountered, they are only traversed from output to input so that their equations are not considered.

The second of the two remaining count storage elements is labelled 54 and has a valid equation (i.e., "count +1") associated therewith. Accordingly, a register transfer operation will result in the value of the count storage element being incremented when the normal-timeperiod "outoff" is active and the value of count is less than or greater than the value of cycle.

As described previously, control primitives include timeperiod primitives for representing control states and decision primitives (i.e., matrixcolumn and matrixrow) for directing control flow. Every clock cycle, a new set of timeperiods are made active based on the previous set of active timeperiods, the values stored in internal data registers and the inputs to the circuit (e.g., reset, enable, which and data inputs). Always-timeperiods are executed every clock cycle, reset-timeperiods are active immediately after the reset input is released, and normal-timeperiods are inactive immediately after a reset. The primary purpose of timeperiods is to enable register transfer operations. When a timeperiod is active, all of the register transfer operations connected thereto via control and data flow paths will be executed provided all associated enabling equations in the respective control flow paths are true.

As was also mentioned previously, each of the matrixcolumn and matrixrow decision primitives has an equation attribute. That is, the circuit designer places a boolean equation based on the status of inputs and the values of circuit registers on the graphical circuit layout next to the matrixcolumn or matrixrow symbol. The matrixcolumn and matrixrow primitives can then be stacked to create very complex control equations from relatively simplistic control equations. Such a feature promotes a simple, regular method of decomposing complex decisions into a decision matrix.

Register transfer operations are created using the aforementioned small set of data-oriented primitives. These data oriented primitives (e.g., storage, memory reference, constant, external input and output, dataflow enable, unary operator and binary operator) represent computation and storage operators.

Accordingly, a complete control flow path need not be drawn by the circuit designer. Rather, only selected portions or fragments need be drawn to represent currently enabled operations. The wiring and control flow imply the existence of interconnect oriented logic such as multiplexors, decoders, buffers and buses. For example, serially connected matrixcolumns and/or matrixrows represent AND operations while parallel connected matrixcolumns and/or matrixrows represent OR operations.

A key feature of such a control and data flow representation is that minimum functionality is specified at each step of a design, with this functionality being broken down into its simplest control and data path operations. Known logic synthesis tools can then be used to combine these simple data path operations into the least complex data path that can execute all of the data path fragments specified by the circuit designer. In so doing, the data path created takes advantage of the control flow characteristics by, for example, sharing adders or registers affected by timeperiods which can never be simultaneously active.

A second exemplary illustration of a circuit layout design is shown in FIG. 3. The FIG. 3 design corresponds to a simple up/down counter with a count value clear feature. As shown in FIG. 3, three timeperiods are provided: an initialize-timeperiod 60, a count-timeperiod 62, and an always-timeperiod 64. Initialize-timeperiod 60 is a reset-timeperiod which becomes active when a reset input is asserted. Count-timeperiod 62 is a normal-timeperiod which is inactive when a reset input is asserted. The always-timeperiod 64 is always active.

A single count storage register labelled cc is also included in the FIG. 3 design and is referred to at four different locations 66, 68, 70 and 72. Further, two inputs labelled ACLR and DOWN and two outputs labelled Q and QZERO are provided. When asserted, the ACLR input 74 clears the count storage register, while the DOWN input 76 distinguishes between up and down counting. The Q output 78 represents the value stored in the register cc, and the output QZERO is asserted when the value stored in the register cc is zero. Unary operators 82 and 84 are provided for either incrementing or decrementing the value stored in the count storage register cc.

In operation, once the circuit designer has drawn a graphical representation of a circuit, such as that shown in any of the foregoing examples, the graphical representation is scanned in a known manner to develop a set of logical equations suitable for input to a known logic synthesizer. For example, in scanning the timeperiod and register transfer operations in the FIG. 3 circuit design, the initialize-timeperiod 60 is first examined. From this examination, it is determined that only one register transfer operation, (i.e., loading a constant value of zero into the register cc via the storage primitive 72) can be enabled via the output 61 of this timeperiod. A exemplary notation which is generated to reflect the condition and action associated with this output of the initialize-timeperiod can be textually encoded as the logical notation:

$$\text{init} \rightarrow \text{cc} := 0.$$

With the next sequential clock cycle, the count-timeperiod 62 is enabled. Several actions can result from activation of the count-timeperiod. For example, via the connection 86, the count-timeperiod will remain active during subsequent clock cycles. Such an operation is reflected in the condition/action notation:

$$\text{count} \rightarrow \text{activate count}.$$

Further, if the equation associated with a matrixcolumn 88 is valid, or true, a register transfer operation will occur. In FIG. 3, the ACLR input 74 is referenced as the equation associated with the matrixcolumn 88. Accordingly, a valid ACLR input will provide a register transfer operation whereby the count storage register 66 is cleared. This function can be textually encoded by the logical notation:

$$\text{count and aclr} \rightarrow \text{cc} := 0.$$

Alternately, if the ACLR input is false, control flows across the matrixcolumn 88 to the count storage register represented as data oriented primitive 70. Branching across the matrixcolumn 88 leads to an increment of the count storage register via a unary operator 82 and count storage register 68 provided the "down" equation associated with matrixcolumn 90 is false. This function can be encoded as the logical notation:

$$\text{count and not aclr and not down} \rightarrow \text{cc} := \text{cc} + 1.$$

If the count storage register cc is to be decremented, then the circuit designer would have rendered the "down" input 76 true. In this case, control would pass down the matrixcolumn 90 to the unary operator 84 to decrement the value placed in the count storage register cc. This function can be textually encoded as the logical notation:

$$\text{count and not aclr and down} \rightarrow \text{cc} := \text{cc} - 1.$$

As mentioned previously, the always-timeperiod is always active. The always timeperiod is connected with the count storage register 66 and the Q output 78. The always timeperiod is also connected with the QZERO output via a matrixrow 92 having an associated equation cc=0. Accordingly, the QZERO output will be asserted true if the value stored in the count storage register cc is zero. This function can be represented textually by the logic notation:

$$\text{cc} = 0 \rightarrow \text{qzero} := 1.$$

Further, the machine will always output the value of the count storage register cc to the Q output. This function can be textually encoded as the logic notation:

TRUE→q:=cc.

By recursively scanning the graphical representation of a circuit beginning with each of the timeperiods included therein, boolean equations such as those referred to above are compiled. Thus, a textual representation of the circuit layout suitable for input to known logic synthesizers can be obtained. For example, a suitable textual compilation of the notations derived from the FIG. 3 circuit design can be formatted in a known language, such as the VHDL or Verilog languages. For example, the textual compilation can be formatted in Verilog as follows:

```
// IO pins
input clk;
input r;
input down;
input aclr;
output [3:0] q;
output qzero;
// local wires
wire count TQ;
wire initTQ;
wire [3:0] ccQ;
wire [3.0:] L16Q;
// latches
diffen #(4) cc
  ((aclr&countTQ)|initTQ) ? 4'D0: (
  ((((-aclr)&down)&count TQ)|(((-aclr)&(-down))&countTQ)) ? L16Q:
  >ccQ,ccQ,1'B1,clk,1'B1);
//timeperiods
diffen #(1) count (r ? 1'B0 : (
  countTQ |
  initTQ),countTQ,1'B1,clk,1'B1);
diffen #(1) init (r ? 1'B1 : (1'B0),initTQ,1'B1,clk,1'B1);
//assign internal variables
assign L16Q=
(((-aclr)&down)&countTQ) ? (ccQ-4'B1):
(((-aclr)&(-down))&countTQ) ? (4'D1+ccQ)
4'bx);
//assign I/Os
assign q=ccQ;
assign qzero=(ccQ==4'D0);
endmodule
```

In this formatted compilation, all inputs and outputs of the circuit layout are first listed (in FIG. 3, the Q output is a four bit output). Local wires are next listed to show the connections which have been detected between the FIG. 3 primitives. For example, the count and initialize timeperiods are connected to the Q output (via the count storage register cc). Further the four bit count storage register cc and a four bit internal variable "L16G" to increment or decrement the Q output are also included.

Latches which have been detected in the FIG. 3 circuit layout are listed next. In representing a circuit using boolean expressions available in a language such as the known Verilog language, "&" symbols constitute a logic AND and "|" symbols constitute a logic OR. For example, with respect to the boolean expression shown in the latches section of the above compilation, if the ACLR input and the count timeperiod are TRUE, the Q output is reset. Alternately, the value of the count storage register is incremented or decremented depending on the status of the ACLR input, the down input and the count timeperiod.

Timeperiods are also detected and specified. The expressions under this heading represent possible actions which can occur during the count and initialize timeperiods of FIG. 3. The first expression under this heading indicates that if a reset (i.e., ACLR input 74) is asserted during a count timeperiod, the circuit is reset and the count timeperiod becomes inactive. Alternately, the initialize timeperiod becomes active during the count timeperiod to initialize the circuit to values shown above. The second expression under the timeperiod heading indicates possible actions which may occur during an active initialize timeperiod. As shown therein, the occurrence of a reset input (i.e., an ACLR input) during the initialize timeperiod will result in a resetting of the FIG. 3 circuit.

The final two sections of the formatted textual representation indicate how the internal variable L16G and input/output relationships are assigned. These expressions indicate that the count storage register will be either decremented or incremented by a value of 1. Finally, input/output pins of the circuit reflect the connection of the count storage register to the Q output or the resetting of this register to a 4 bit value of zero.

It will be appreciated by those of ordinary skill in the art that the present invention can be embodied in other specific forms without departing from the spirit or essential characteristics thereof. The presently disclosed embodiments are therefore considered in all respects to be illustrative and not restricted. The scope of the invention is indicated by appended claims rather than the foregoing description, and all changes that come within the meaning and range and equivalents thereof are intended to be embraced therein.

What is claimed is:

1. A method of designing a circuit comprising the steps of:

graphically representing both control flow and data flow of the circuit using control primitives and data oriented primitives, said control primitives being indicative of circuit state transitions and said data oriented primitives being indicative of selected datapath elements as affected by said circuit state transitions, such that functional and structural elements of the circuit representation are intermixed;

recursively analyzing said graphical representation to produce a textual representation of said circuit, said textual representation being suitable for synthesizing a logic design of the circuit.

2. A method according to claim 1, wherein at least one of a primitive and a data oriented primitive used to represent a given control feature and data flow, respectively, is placed at plural locations in said graphical representation.

3. A method according to claim 2, wherein control primitives include timeperiod primitives to represent circuit timing and decision primitives which form a logical decision matrix.

4. A method according to claim 3, wherein said decision primitives indicate an action which occurs if at least one given condition is satisfied, said step of graphically representing further including a step of labelling each decision primitive with a logic equation to establish said at least one condition.

5. A method according to claim 4, wherein said step of graphically representing includes identifying different types of control primitives and data oriented primitives with different symbols.

6. A method according to claim 3, wherein said textual representation is produced by analyzing a relationship between at least one timeperiod control primitive and at least one data oriented primitive.

7. A method according to claim 6, wherein analysis of said textual representation includes:

detecting existence of a connection path between said at least one timeperiod control primitive and said at least one data oriented primitive in said graphical representation, and detecting a logic condition of any decision control primitives in said connection path which must exist to complete said path.

8. A method according to claim 7, wherein serial connections of primitives in said connection path represent logical AND operations and parallel connections of primitives in said connection path represent logical OR operations.

9. A method according to claim 3, wherein said data oriented primitives include circuit inputs and outputs, storage elements, mathematical operators and memory references.

10. A method according to claim 9, wherein said mathematical operators include constants, unary operators and binary operators.

11. A method of designing and implementing a circuit layout comprising the steps of:

drawing the circuit layout graphically using control primitives and data oriented primitives, said control primitives being indicative of circuit state transitions and said data oriented primitives being indicative of selected datapath elements as affected by said circuit state transitions, such that functional and structural elements of the circuit representation are intermixed;

labelling at least some of said control primitives in said drawing with first logic expressions;

recursively analyzing said labelled drawing automatically to derive a set o logic expressions indicative of control flow and data flow in the circuit layout; and inputting said set of logic expressions to a logic synthesizer for implementing said circuit layout.

12. A method according to claim 11, wherein said set of logic expressions is derived from interconnections of said control primitives, said data oriented primitives and said first logic expressions.

13. A method of designing a circuit comprising the steps of:

graphically illustrating both control flow and data flow of the circuit using control primitives and data oriented primitives, at least some of which are connected to form control paths and data paths, said control primitives being indicative of circuit state transitions and said data oriented primitives being indicative of selected datapath elements as affected by said circuit state transitions, such that functional and structural elements of the circuit representation are intermixed; and, labelling at least some of said control primitives with logical expressions to establish conditions associated with activation of said control paths and said data paths.

14. A method according to claim 13, wherein said control primitives include timeperiod primitives to indicate control flow by enabling register transfer operations within said circuit.

15. A method according to claim 14, wherein said control primitives include decision primitives having logical expressions associated therewith.

16. A method according to claim 15, wherein said control primitives can be combined in said control paths and said data paths to form more complex logic expressions.

* * * * *